United States Patent
Annapragada et al.

(10) Patent No.: US 6,777,344 B2
(45) Date of Patent: Aug. 17, 2004

(54) POST-ETCH PHOTORESIST STRIP WITH $O_2$ AND $NH_3$ FOR ORGANOSILICATE GLASS LOW-K DIELECTRIC ETCH APPLICATIONS

(75) Inventors: Rao V. Annapragada, Union City, CA (US); Ian J. Morey, Singapore (SG); Chok W. Ho, Milpitas, CA (US)

(73) Assignee: Lam Research Corporation, Fremont, CA (US)

( * ) Notice: Subject to any disclaimer, the term of this patent is extended or adjusted under 35 U.S.C. 154(b) by 297 days.

(21) Appl. No.: 09/782,678

(22) Filed: Feb. 12, 2001

(65) Prior Publication Data

US 2002/0111041 A1 Aug. 15, 2002

(51) Int. Cl.$^7$ .................. H01L 21/302; H01L 21/461
(52) U.S. Cl. .................. 438/725; 438/723; 438/710
(58) Field of Search ............... 438/710, 725, 438/723, 706, 694, 637

(56) References Cited

U.S. PATENT DOCUMENTS

| | | | |
|---|---|---|---|
| 4,885,047 A | * 12/1989 | Ury et al. | 156/345.5 |
| 5,071,485 A | * 12/1991 | Matthews et al. | 134/2 |
| 5,230,772 A | 7/1993 | Kadomura | 156/643 |
| 5,262,279 A | * 11/1993 | Tsang et al. | 430/311 |
| 5,266,157 A | 11/1993 | Kadomura | 156/659.1 |
| 5,741,396 A | 4/1998 | Loewenstein | 156/643.1 |
| 5,814,563 A | 9/1998 | Ding et al. | 438/714 |
| 5,877,032 A | 3/1999 | Guinn et al. | 438/9 |
| 5,970,376 A | 10/1999 | Chen | 438/637 |
| 6,037,255 A | 3/2000 | Hussein et al. | 438/675 |
| 6,040,248 A | 3/2000 | Chen et al. | 438/725 |
| 6,046,115 A | * 4/2000 | Molloy et al. | 438/710 |
| 6,069,091 A | 5/2000 | Chang et al. | 438/719 |
| 6,080,529 A | 6/2000 | Ye et al. | 430/318 |
| 6,105,588 A | 8/2000 | Li et al. | 134/1.1 |
| 6,124,213 A | 9/2000 | Usami et al. | 438/710 |
| 6,143,476 A | 11/2000 | Ye et al. | 430/318 |

(List continued on next page.)

FOREIGN PATENT DOCUMENTS

| | | | |
|---|---|---|---|
| EP | 0851474 A2 | 7/1998 | H01L/21/321 |
| JP | 62094933 | 5/1987 | H01L/21/302 |
| JP | 01025419 | 1/1989 | H01L/21/302 |
| JP | 01059820 | 3/1989 | H01L/21/302 |
| JP | 09036089 | 2/1997 | H01L/21/3065 |
| WO | 00/24048 | 4/2000 | H01L/21/311 |
| WO | 00/67308 | 11/2000 | H01L/21/311 |
| WO | WO01/04707 A1 | 1/2001 | G03F/7/42 |
| WO | 01/04707 A1 | 1/2001 | H01L/21/311 |
| WO | 01/29879 A2 | 4/2001 | |
| WO | 01/29879 A2 | 4/2001 | |
| WO | 01/59825 A1 | 8/2001 | H01L/21/311 |
| WO | WO01/59825 A1 | 8/2001 | H01L/21/311 |

OTHER PUBLICATIONS

U.S. patent application Ser. No. 09/782,185, filed Feb. 12, 2001.

Delsol et al., "Transformer Coupled Plasma Dielectric Etch for 0.25 $\mu$m Technologies", Microelectronic Engineering 50 (2000) p. 75–80.

(List continued on next page.)

*Primary Examiner*—Richard Elms
*Assistant Examiner*—Beth E. Owens
(74) *Attorney, Agent, or Firm*—Beyer Weaver & Thomas, LLP

(57) ABSTRACT

Process for stripping photoresist from a semiconductor wafer formed with at least one layer of OSG dielectric. The stripping process may be formed in situ or ex situ with respect to other integrated circuit fabrication processes. The process includes a reaction may be oxidative or reductive in nature. The oxidative reaction utilizes an oxygen plasma. The reductive reaction utilizes an ammonia plasma. The process of the present invention results in faster ash rates with less damage to the OSG dielectric than previously known stripping methods.

13 Claims, 2 Drawing Sheets

U.S. PATENT DOCUMENTS

| | | | | |
|---|---|---|---|---|
| 6,153,511 | A | 11/2000 | Watatani | 438/623 |
| 6,169,036 | B1 * | 1/2001 | Bhowmik et al. | 438/710 |
| 6,174,796 | B1 | 1/2001 | Takagi et al. | 438/622 |
| 6,194,128 | B1 | 2/2001 | Tao et al. | 430/313 |
| 6,245,663 | B1 | 6/2001 | Zhao et al. | 438/622 |
| 6,265,319 | B1 | 7/2001 | Jang | 438/723 |
| 6,265,320 | B1 | 7/2001 | Shi et al. | 438/725 |
| 6,281,135 | B1 * | 8/2001 | Han et al. | 438/725 |
| 6,291,334 | B1 | 9/2001 | Somekh | 438/620 |
| 6,310,020 | B1 * | 10/2001 | Shirota et al. | 510/176 |
| 6,331,380 | B1 * | 12/2001 | Ye et al. | 430/318 |
| 6,333,268 | B1 * | 12/2001 | Starov et al. | 438/691 |
| 6,337,279 | B1 * | 1/2002 | Huang et al. | 438/692 |
| 6,342,446 | B1 | 1/2002 | Smith et al. | 438/687 |
| 6,352,918 | B1 | 3/2002 | Huang et al. | 438/623 |
| 6,352,937 | B1 * | 3/2002 | Kadomura et al. | 438/725 |
| 6,355,572 | B1 | 3/2002 | Ikegami | 438/706 |
| 6,383,724 | B1 * | 5/2002 | Carter et al. | 430/329 |
| 6,436,808 | B1 * | 8/2002 | Ngo et al. | 438/623 |
| 6,475,922 | B1 * | 11/2002 | Zheng | 438/725 |
| 6,620,733 | B2 | 9/2003 | Ho | |
| 2001/0024769 | A1 * | 9/2001 | Donoghue et al. | 430/329 |
| 2002/0081855 | A1 * | 6/2002 | Jiang et al. | 438/694 |
| 2002/0108929 | A1 | 8/2002 | Ho | |
| 2002/0111036 | A1 | 8/2002 | Zhu | |

OTHER PUBLICATIONS

Eto et al., "High Selectivity Photoresist Ashing by the Addition of $NH_3$ to $CF_4/O_2$ or $CHF_3/O_2$", SID 99 Digest, p. 844–847.

Hasegawa et al., "Copper Dual Damascene Interconnects with Low–K ($K_{eff}$ <3.0) Dielectrics Using FLARE™ and an Organo–Silicate Hard Mask", IEDM 99, p. 623–626.

Janowiak et al., "Etching of Organic Low Dielectric Constant Material SiLK™ on the Lam Research Corporation 4520XLE™", J. Vac. Sci. Technol. A 18(4), Jul./Aug. 2000, p. 1859–1863.

Lin et al., "Microwave Imaging of Cerebral Edema", Proceedings of the IEEE, vol. 70, No. 5, May 1982, p. 523–524.

Plummer et al., "Silicon VLSI Technology, Fundamentals, Practice and Modeling", Prentice Hall (2000), p. 639.

International Search Report, dated Nov. 20, 2002.

International Search Report, dated Dec. 12, 2002.

International Search Report, dated Feb. 4, 2003.

Hasegawa et al., "Copper Dual Damascene Interconnects with Low–K ($K_{eff}$ <3.0) Dielectrics Using FLARE™ and an Organo–Silicate Hard Mask", 1999 IEEE, pp. 26.4.1–26.4.4.

International Search Report, Nov. 22, 2002.

* cited by examiner

POST-ETCH PHOTORESIST STRIP WITH $O_2$ AND $NH_3$ FOR ORGANOSILICATE GLASS LOW-K DIELECTRIC ETCH APPLICATIONS

RELATED APPLICATIONS

This application is related to the commonly assigned U.S. patent application Ser. No.: 09/782,185 entitled UNIQUE PROCESS CHEMISTRY FOR ETCHING ORGANIC LOW-K MATERIALS, by Helen H. Zhu et al., filed concurrently herewith and incorporated herein by reference.

This application is also related to the commonly assigned U.S. patent application Ser. No.: 09/782,446 entitled USE OF AMMONIA FOR ETCHING ORGANIC LOW-K DIELECTRICS, by Chok W. Ho et al., filed concurrently herewith and incorporated herein by reference.

This application is also related to the commonly assigned U.S. patent application Ser. No.: 09/782,437 entitled USE OF HYDROCARBON ADDITION FOR THE ELIMINATION OF MICROMASKING DURING ETCHING OF ORGANIC LOW-K DIELECTRICS, by Chok W. Ho, filed concurrently herewith and incorporated herein by reference.

FIELD OF THE INVENTION

The present invention relates to semiconductor or integrated circuit manufacture. More particularly, the present invention relates the stripping of photoresist from a wafer during manufacture of the integrated circuit. Still more particularly, the present invention relates to the manufacture of semiconductor devices including at least one layer of organosilicate glass dielectric by stripping the dielectric from the wafer.

BACKGROUND OF THE INVENTION

Integrated circuits use dielectric layers, which have typically been formed from silicon dioxide, $SiO_2$, to insulate conductive lines on various layers of a semiconductor structure. As semiconductor circuits become faster and more compact, operating frequencies increase and the distances between the conductive lines within the semiconductor device decrease. This introduces an increased level of coupling capacitance to the circuit, which has the drawback of slowing the operation of the semiconductor device. Therefore, it has become important to use dielectric layers that are capable of effectively insulating conductive lines against such increasing coupling capacitance levels.

In general, the coupling capacitance in an integrated circuit is directly proportional to the dielectric constant, k, of the material used to form the dielectric layers. As noted above, the dielectric layers in conventional integrated circuits have traditionally been formed of $SiO_2$, which has a dielectric constant of about 4.0. As a consequence of the increasing line densities and operating frequencies in semiconductor devices, dielectric layers formed of $SiO_2$ may not effectively insulate the conductive lines to the extent required to avoid increased coupling capacitance levels.

In an effort to reduce the coupling capacitance levels in integrated circuits, the semiconductor industry has engaged in research to develop materials having a dielectric constant lower than that of $SiO_2$, which materials are suitable for use in forming the dielectric layers in integrated circuits. To date, a number of promising materials, which are sometimes referred to as "low-k materials", have been developed. Many of these new dielectrics are organic compounds. In the specification and claims, low-k materials are defined as materials with a dielectric constant k that is less than 3.

Low k materials include, but are specifically not limited to: benzocyclobutene or BCB; Flare™ manufactured by Allied Signal® of Morristown, N.J., a division of Honeywell, Inc., Minneapolis, Minn.; one or more of the Parylene dimers available from Union Carbide® Corporation, Danbury Conn.; polytetrafluoroethylene or PTFE; and SiLK®. One PTFE suitable for IC dielectric application is SPEEDFILM™, available from W. L. Gore & Associates, Inc, Newark, Del. SiLK®, available from the Dow® Chemical Company, Midland, Mich., is a silicon-free BCB.

One interesting class of organic low-k materials is compounds including organosilicate glass, or OSG. By way of example, but not limitation, such organosilicate dielectrics include CORAL™ from Novellus of San Jose, Calif.; Black Diamond™ from Applied Materials of Santa Clara, Calif.; Sumika Film® available from Sumitomo Chemical America, Inc., Santa Clara, Calif., and HOSP™ from Allied Signal of Morristown, N.J. Organosilicate glass materials have carbon and hydrogen atoms incorporated into the silicon dioxide lattice which lowers the dielectric constant of the material.

During semiconductor wafer processing, features of the semiconductor device are defined in the wafer using well-known patterning and etching processes. In these processes a photoresist (PR) material is deposited on the wafer and then is exposed to light filtered by a reticle. The reticle is generally a glass plate that is patterned with exemplary feature geometries that blocked light from propagating through the reticle.

After passing through the reticle, the light contacts the surface of the photoresist material. The light changes the chemical composition of the photoresist material such that a developer can remove a portion of the photoresist material. In the case of positive photoresist materials the exposed regions are removed, and in the case of negative photoresist materials the unexposed regions are removed. Thereafter the wafer is etched to remove the underlying material from the areas that are no longer protected by the photoresist material and thereby define the desired features in the wafer. Low-k organic polymers in general can be etched by oxidation (e.g. oxygen-based) or reduction (e.g. hydrogen-based) chemical processes. OSG dielectrics may be advantageously etched using chemistries somewhat similar to oxide etch chemistries.

The etching of dielectrics may be advantageously accomplished in a dual-frequency capacitively-coupled, (DFC) dielectric etch system. One such is Lam® Research model Exelan HP™, available from Lam® Research Corporation, Fremont Calif. The Exelan HP™ system processes an extremely comprehensive dielectric etch portfolio in one system. Processes include contacts and vias, bi-level contacts, borderless contacts, nitride and oxide spacers, and passivation.

Advanced etch systems like the 4520XLE™ perform several processes in the same system. By performing many different semiconductor fabrication steps in a single system, wafer throughput can be increased. Even further advanced systems contemplate the performance of additional steps within the same equipment. Again by way of example, but not limitation, Lam® Research Corporation's Exelan™ system is a dry etch system capable of performing many process steps in a single apparatus. Exelan™ enables hardmask open, inorganic and organic ARC etch, and photoresist strip to be performed in situ with a single chamber. This system's extensive process portfolio includes all dual damascene structures, contacts, vias, spacers, and passivation etch in doped and undoped oxides and low-k dielectrics required in the sub-0.18 micron environment. Of course, the principles enumerated herein may be implemented in wide variety of semiconductor fabrication systems, and these principles specifically contemplate all such alternatives.

As used herein, the term in situ refers to one or more processes performed on a given substrate, such as a silicon wafer, in the same piece of semiconductor fabrication equipment without removing the substrate from the equipment.

During fabrication of a semiconductor device, it is necessary during the repeated patterning, etching, and deposition of the various film layers which make up the device to remove the patterned photoresist following an etching or deposition step. While a number of photoresist removal technologies and methods have been implemented, in order to maintain the high throughput required by today's semiconductor manufacturers, the stripping of photoresist from semiconductor wafers within the etching equipment is highly desirable.

Because OSG materials are basically organically doped oxides, most current photoresist materials tend to have similar chemical characteristics with the organic component of OSG material. In addition, current ex situ processes using an $O_2$ strip, may use a down stream plasma where a substrate may be heated to temperature above 200° C. Accordingly, when utilizing a known oxygen-based methodology to remove organic material such as photoresist from the cap plate at the wafer's surface, known $O_2$ strip processes at temperatures above 200° C. have the capability of removing organic material and hydrogen not only from the surface of the wafer, but potentially may also deleteriously remove organic material from the sidewall of the etched feature, or any other exposed surface. Moreover, OSG materials are susceptible to oxidation when exposed to oxygen plasma at high temperatures. The oxygen removes carbon and hydrogen from the OSG film, thereby rendering the films unstable and causing the dielectric constant of the film to increase. Of course, $O_2$ also provides significantly better strip rates for organic photoresists than most other strip chemistries.

Accordingly, what is desired is a methodology for performing dry photoresist stripping of OSG materials utilizing an oxygen-based stripping process, but without the previously discussed deleterious effects normally associated with this strip chemistry.

One methodology which has been used by downstream microwave plasma ashers is the use of N2/H2 to make those equipments compatible with OSG. The main limitation to this method appears to be low strip rates and the necessity to perform the strips ex-situ.

Accordingly, what is further desirable is a post-tech stripping methodology for use with copper-containing devices which is capable of similar strip rates as the previously discussed oxygen based strip process, but without the copper damage problems usually associated with oxygen strip methodologies. The methodology should be capable of sufficiently high strip rates as to render the methodology practicable in today's high-throughput world, thereby lowering the overall cost of ownership of the equipment by its ultimate user.

In order to maintain a high wafer throughput, what is also desirable is that the methodology be capable of being performed in situ within the fabrication equipment utilized to form the wafer.

Finally, it is desirable that the process be performed with either no or minimal post-strip residue remaining on the film surface, post-strip.

These and other advantages of the present invention will become apparent upon reading the following detailed descriptions and studying the various figures of the Drawing.

SUMMARY OF THE INVENTION

The present invention teaches a process for stripping photoresist from a semiconductor wafer formed with at least one layer of OSG dielectric, utilizing a reaction implemented by a plasma formed within an etching apparatus. The stripping process may be formed in situ or ex situ with respect to other integrated circuit fabrication processes. This reaction may be oxidative or reductive in nature. The oxidative reaction contemplated by the present invention utilizes an oxygen plasma. The reductive reaction utilizes an ammonia plasma. The methodology described herein results in faster ash rates with less damage to the OSG dielectric than previously known stripping methods. In such processes the temperature of the semiconductor wafer may be kept at a temperature between −10° C. and 60° C.

These and other advantages of the present invention will become apparent upon reading the following detailed descriptions and studying the various figures of the Drawing.

BRIEF DESCRIPTION OF THE DRAWING

For more complete understanding of the present invention, reference is made to the accompanying Drawing in the following Detailed Description of the Invention. In the drawing.

Figure 1:
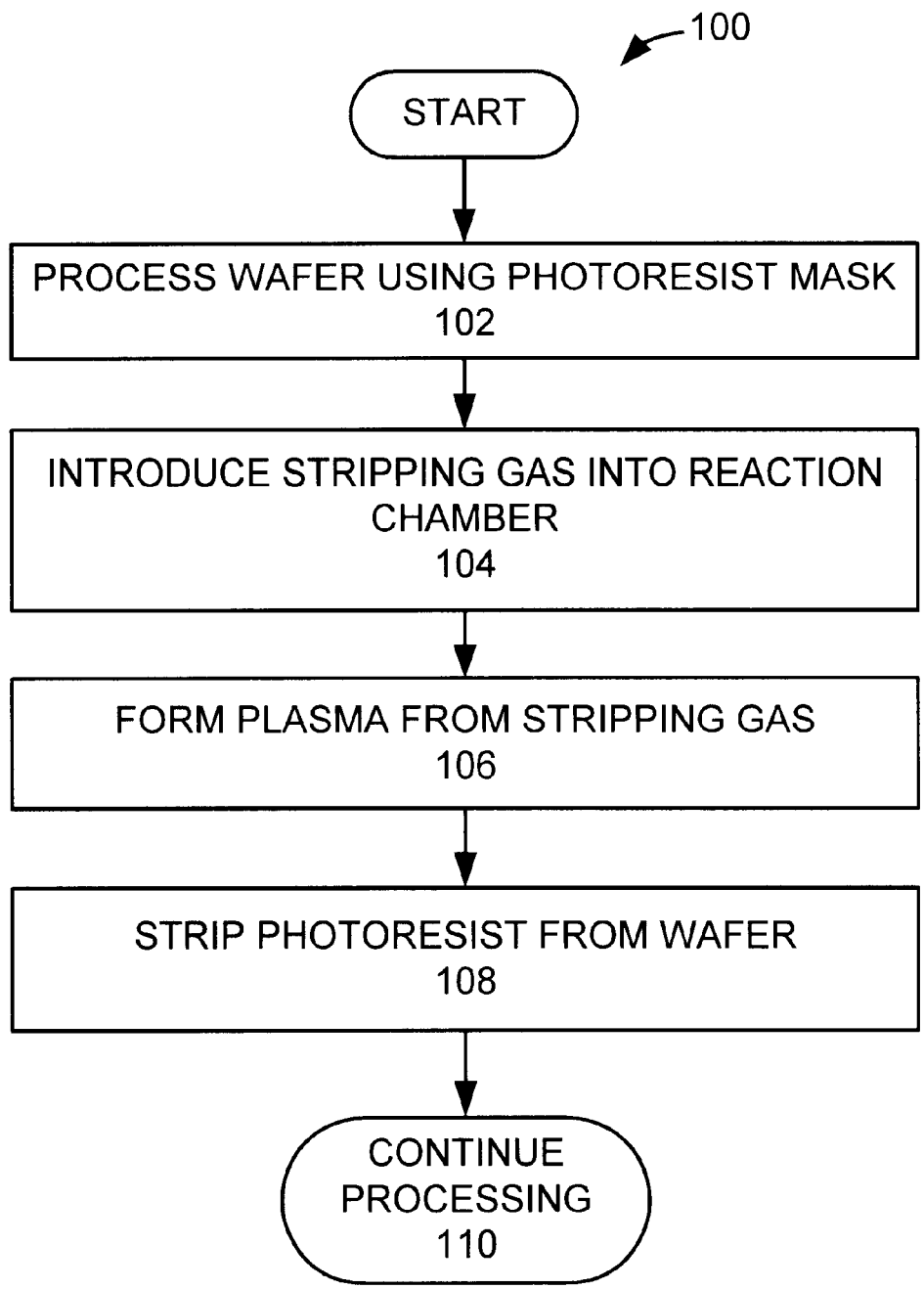
FIG. 1 is a flow chart of the present invention.

Reference numbers refer to the same or equivalent parts of the invention throughout the several figures of the Drawing.

DETAILED DESCRIPTION OF THE PREFERRED EMBODIMENTS

The present invention teaches an in situ or ex situ process for stripping photoresist from a semiconductor wafer formed with at least one layer of OSG dielectric, utilizing a reaction implemented by a plasma formed within an etching apparatus. The stripping process may be formed in situ or ex situ with respect to other integrated circuit fabrication processes. This reaction may be oxidative or reductive in nature. The oxidative reaction contemplated by the present invention utilizes an oxygen plasma. The reductive reaction utilizes an ammonia plasma.

Figure 2:
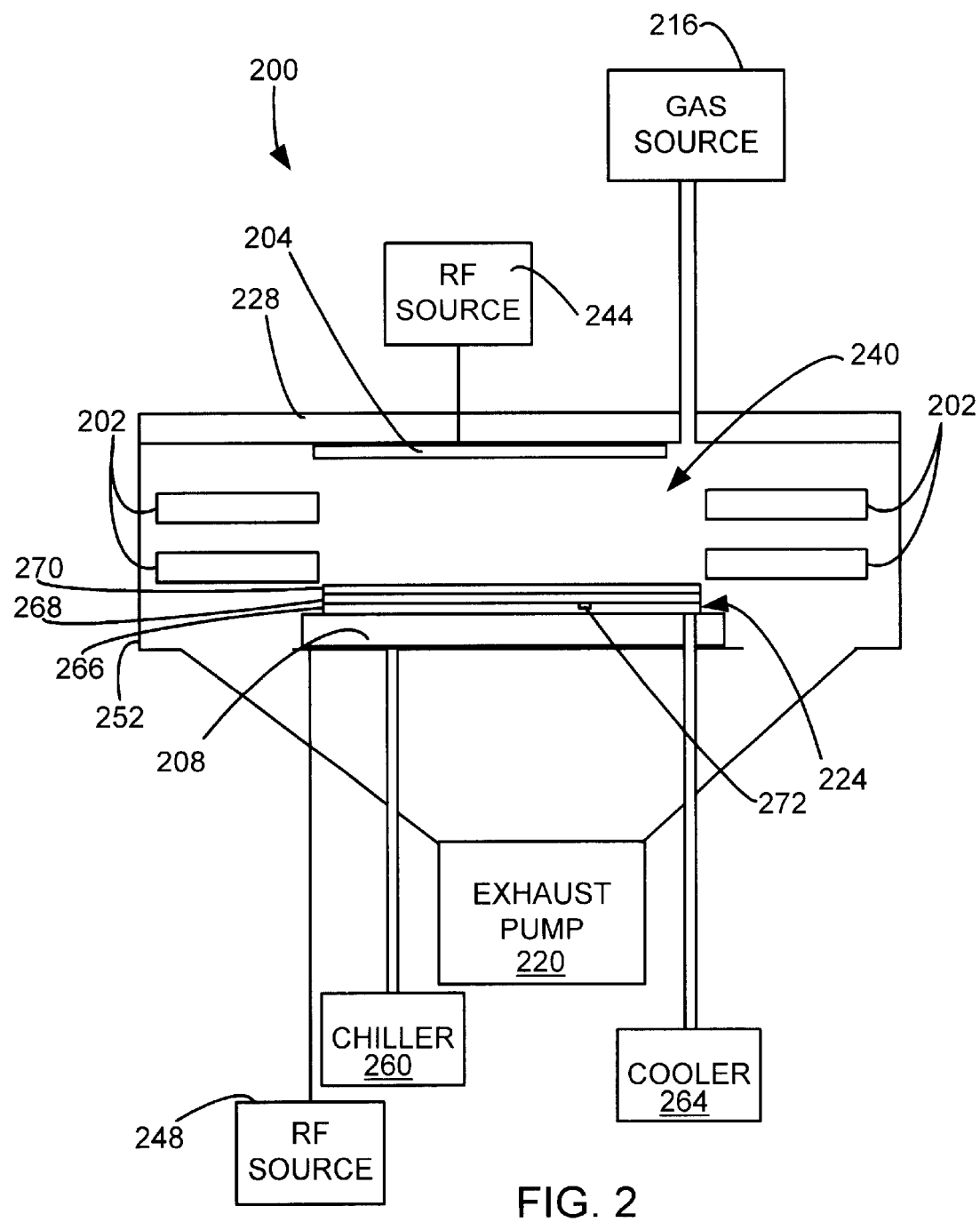
FIG. 2 is a schematic view of a plasma processing chamber that may be used in a preferred embodiment of the invention.

Having reference now to FIG. 1, according to one embodiment of the present invention, there is presented a method, 100, for stripping photoresist from a semiconductor wafer incorporating at least one layer of organosilicate dielectric. A semiconductor wafer formed with at least one layer of OSG is placed in the reaction vessel of a dual-frequency capacitively-coupled, (DFC) dielectric etch system. To facilitate discussion, FIG. 2 is a schematic view of a plasma processing chamber 200 that may be used in a preferred embodiment of the invention. The plasma processing chamber 200 comprising confinement rings 202, an upper electrode 204, a lower electrode 208, a gas source 216, and an exhaust pump 220. Within plasma processing chamber 200, the semiconductor wafer 224 is positioned upon the lower electrode 208. The lower electrode 208 incorporates a suitable substrate chucking mechanism (e.g., electrostatic, mechanical clamping, or the like) for holding the semiconductor wafer 224. The reactor top 228 incorporates the upper electrode 204 disposed immediately opposite the lower electrode 208. The upper electrode 204, lower electrode 208, and confinement rings 202 define the confined plasma volume 240. Gas is supplied to the confined plasma volume 240 by gas source 216 and is exhausted from the confined plasma volume 240 through the confinement rings 202 and an exhaust port by the exhaust pump 220. A first RF source 244 is electrically connected to the upper electrode 204. A second RF source 248 is electrically connected to the lower electrode 208. Different combinations of connecting RF power to the electrode are possible. In case of the Lam® Research model Exelan HP™, available from Lam® Research Corporation, Fremont Calif., both RF sources are connected to the lower electrode and the upper electrode is grounded. Chamber walls 252 surround the confinement rings 202, the upper electrode 204, and the lower electrode 208. Both the first RF source 244 and the second RF source 248 may comprise a 27 MHz power source and a 2 MHz power source. The upper electrode 204 and the lower electrode are spaced are preferably spaced apart by a distance of about 1.35 cm but may have a spacing up to 2.0 cm. A chiller 260 may be connected to the bottom electrode 208. A cooler 264 may be connected to the back side of the wafer 224. The cooler 264 may use helium to provide the cooling. The wafer 224 may beta substrate 266 covered with at least layer of OSG dielectric 268 under a photoresist mask 270. The wafer 224 may have a copper contact 272.

At step 102, at least one semiconductor fabricating or forming step using the photoresist mask 270 is performed on the wafer 224. By way of example, but not limitation, such forming or fabricating steps include photoresist patterning, etching, and deposition. Following the fabrication step, at step 104 a flow of photoresist stripping gas is introduced into the reaction vessel. Energy may be provided by the first RF source 244 and the second RF source 248, which energizes and ionizes the gas forming a plasma from the stripping gas above the wafer 224 (step 106). The plasma is partially confined to the confined plasma volume 240 above the wafer 224, where the plasma is able to strip the photoresist on the wafer (step 108), without damage to the organosilicate dielectric, and without degrading the dielectric properties of the organosilicate. The plasma is then vented past the confinement rings 202 to the exhaust pump 220. The confinement rings 202 reduce plasma interaction with the chamber walls 252. The photoresist stripping gas is a mixture of gases containing a substantially inert diluent, for instance nitrogen, and an active stripping agent. According to this invention, this active stripping agent is one of oxygen or ammonia. Alternative diluents may, with equal facility, be implemented. The concentration of stripping agent within the stripping gas varies with application, as discussed later. The chiller 260 and the cooler may be used to keep the wafer to a temperature between −10° C. to 60° C. More preferably, the wafer is maintained at temperatures between −10° C. to 40° C. Most preferably, the wafer is maintained at a temperature of about 20° C. Following completion of the stripping at step 108, the wafer is ready for further processing or manufacturing at 110.

The present invention contemplates varying a number of process parameters to achieve satisfactory results on a wide variety of wafer stacks to effect a wide variety of semiconductor design. Various factors including desired effect, throughput, and system capabilities will define optimal combinations of process parameters to accomplish the desired design. Each of the combinations so utilized is specifically contemplated by the present invention.

In order to investigate the effects of varying several of the process parameters of the present invention, a series of test wafers were prepared and processed. The silicon test wafers comprised wafer stacks including a barrier layer formed of SiO or SiC, over which a layer of OSG dielectric was deposited. A layer of patterned Deep-UV photoresist was applied over the OSG dielectric. One dielectric tested was Novellus' Coral. Deep-UV photoresists are available from Arch Chemicals, Inc., North Kingstown, R.I. Another dielectric tested was Black Diamond™ from Applied Materials of Santa Clara, Calif. Features, including vias and trenches, were etched in the test wafers. The design of these test wafers is for experimental purposes only. As is known by those having ordinary skill in the art, intervening layers may be interposed between the substrate and the OSG and between the OSG and the photoresist, and alternative films, and film thicknesses may by implemented with equal facility to attain a desired design goal. One such film is a hard mask deposited beneath the photoresist. Each of these alternatives is of course contemplated by the present invention.

Each of the test wafers was placed in the reaction vessel or chamber of a semiconductor manufacturing system, for instance a Lam® Research model 4520XLE™ dual-frequency capacitively-coupled, (DFC) dielectric etch system, or other suitable equipment. In actual integrated circuit manufacture one or more semiconductor manufacturing steps would have been optionally performed at this point. These steps include, but are specifically not limited to patterning, etching, deposition, planarization, doping, metalization, and other semiconductor forming steps well known to those having ordinary skill in the art.

Substantially all the photoresist was then stripped from the wafer as follows: Dual frequency power at 27 and 2 MHz was applied to the system. A flow of stripping gas, including one of the previously discussed active stripping agents, was then introduced into the reaction chamber and a plasma was struck. After performing each of the tests, the test wafers were analyzed to determine the strip, or ash rate, the uniformity of ashing or stripping across the surface of the wafer, and the percentile change of carbon content of the OSG dielectic layer measured by Fourier Transform Infrared Spectroscopy (FTIR). As a result the following preferred embodiments were found. These preferred embodiments will be presented as examples to be compared with an example best known method using the prior art N2/H2.

EXAMPLES

Example of Prior Art

In the best known method, or BKM, stripping process incorporating H2 as the active stripping agent, the wafers were placed in a Lam™ Research model Exelan HP™ dual-frequency capacitively-coupled, (DFC) dielectric etch system. Substantially all the photoresist was then stripped from the wafer as follows: A flow of $H_2/N_2$ stripping gas was introduced into the reaction chamber. Dual frequency power at 27 and 2 MHz was applied to the system. The higher frequency power source provided about 400 W at 27 MHz. The lower frequency power source provided about 400 W at 2 MHz. H2 was provided into the chamber at 600 sccm. N2 was provided into the chamber at 1900 sccm. Chamber pressure was maintained at about 470 mTorr. From this process, the % change in the SiC/SiO ratio on blanket films measured by FTIR is 5% when the test dielectric was Coral and 5.01% when the test dielectric was Black Diamond. The measured ash rate was 4,150 Å/min.

Example of O2 Stripping

In the best known method, or BKM, a preferred embodiment incorporating O2 as the active stripping agent the wafers were placed in a Lam™ Research model Exelan HP™ dual-frequency capacitively-coupled, (DFC) dielectric etch system. Substantially all the photoresist was then stripped from the wafer as follows: A flow of $O_2/N_2$ stripping gas was introduced into the reaction chamber. Dual frequency power at 27 and 2 MHz was applied to the system. The higher frequency power source provided about 200 W at 27 MHz. The lower frequency power source provided about 100 W at 2 MHz. $O_2$ was provided into the chamber at 1,000 sccm. N2 was provided into the chamber at 200 sccm. Chamber pressure was maintained at about 330 mTorr. From this process, the % change in the SiC/SiO ratio on blanket films measured by FTIR is 4.1% when the test dielectric was Coral and 3.6% when the test dielectric was Black Diamond. The measured ash rate was 10,600 Å/min.

These tests demonstrated that an oxygen-based stripping process may be performed at substantially higher ash rates than prior hydrogen based processes, at lower OSG carbon content change rates, and with minimal damage to the OSG.

Alternative embodiments of this aspect of the present invention contemplate higher frequency power source power to be from about 100W to about 2000W. More particularly, the higher frequency power source power would be from about 50W to about 1000W. More particularly still the higher frequency power source power would be from about 150W to about 500W. More particularly still the higher frequency power source power would be from about 175W to about 350W. Most particularly, the higher frequency power source power is about the previously discussed 200W. The higher frequency power source preferably has a frequency in the range of 15 MHz to 40 MHz. More preferably, the higher frequency power source has a frequency in the range of 20 MHz to 35 MHz. Most preferably, the higher frequency power source has a frequency in the range of 25 MHz to 30 MHz.

Alternative embodiments of this aspect of the present invention contemplate a lower frequency power source power from about 0W to about 2000W. More particularly, the lower frequency power source power is from about 50W to about 1000W. More particularly still the lower frequency power source power is from about 50W to about 500W. More particularly still the lower frequency power source power is from about 75W to about 350W. Most particularly, the lower frequency power source power is at about the previously discussed 100W. The lower frequency power source preferably has a frequency in the range of 0.3 MHz to 10 MHz. More preferably, the lower frequency power source has a frequency in the range of 1 MHz to 5 MHz. Most preferably, the lower frequency power source has a frequency in the range of 1.5 MHz to 4 MHz.

Alternative embodiments of this aspect of the present invention contemplate diluent gas flows from about 50 sccm to about 2000 sccm. More particularly, diluent flows are from about 100 sccm to about 1500 sccm. More particularly still diluent flows are from about 150 sccm to about 500 sccm, and most particularly diluent flows are at about 200 sccm.

Alternative embodiments of this aspect of the present invention also contemplate O2 active stripping agent flows from about 150 sccm to about 3500 sccm. More particularly, O2 flows are from about 500 sccm to about 2500 sccm. More particularly still diluent flows are from about 700 sccm to about 1500 sccm, and most particularly at about 1000 sccm.

Similarly, alternative embodiments contemplate chamber pressures from about 50 mTorr to about 1000 mTorr. More particularly from about 100 mTorr to about 500 mTorr. More particularly still from about 300 mTorr to about 400 mTorr, and most particularly about 330 mTorr.

Those having ordinary skill in the art will appreciate that one or more of the previously discussed process variables may need to be modified for a particular application.

Example of NH3 Stripping

In the best known method, or BKM, a preferred embodiment incorporating NH3 as the active stripping agent the wafers were placed in a Lam™ Research model Exelan HP™ dual-frequency capacitively-coupled, (DFC) dielectric etch system. Substantially all the photoresist was then stripped from the wafer as follows: A flow of NH3 stripping gas was introduced into the reaction chamber. Dual frequency power at 27 and 2 MHz was applied to the system. The higher frequency power source provided about 600 W at 27 MHz. The lower frequency power source provided no power at 2 MHz. NH3 was provided into the chamber at 1,500 sccm. Chamber pressure was maintained at about 350 mTorr. From this process, the % change in the SiC/SiO ratio on blanket films measured by FTIR is 2.5% when the test dielectric was Coral and 1.64% when the test dielectric was Black Diamond. The measured ash rate was 5,470 Å/min.

These tests demonstrated that an ammonia-based stripping process may be performed at higher ash rates than prior hydrogen based processes, at lower OSG carbon content change rates, and with minimal damage to the OSG.

Alternative embodiments of this aspect of the present invention contemplate higher frequency power source power from about 100W to about 2000W. More particularly, the higher frequency power source power is about 50W to about 1000W. More particularly still the higher frequency power source power is about 250W to about 750W. More particularly still the higher frequency power source power is about 500W to about 750W. Most particularly, the higher frequency power source power is at about the previously discussed 600W. The higher frequency power source preferably has a frequency in the range of 15 MHz to 40 MHz. More preferably, the higher frequency power source has a frequency in the range of 20 MHz to 35 MHz. Most preferably, the higher frequency power source has a frequency in the range of 25 MHz to 30 MHz.

Alternative embodiments of this aspect of the present invention contemplate 2 MHz power source power from about 100W to about 2000W. More particularly, the lower frequency power source power is about 0W to about 1000W. More particularly still the lower frequency power source power is from about 0W to about 500W. More particularly still the lower frequency power source power is from about 0W to about 350W. Most particularly, the lower frequency power source power is at about the previously discussed 0W. The lower frequency power source preferably has a frequency in the range of 0.3 MHz to 10 MHz. More preferably, the lower frequency power source has a frequency in the range of 1 MHz to 5 MHz. Most preferably, the lower frequency power source has a frequency in the range of 1.5 MHz to 4 MHz.

Alternative embodiments of this aspect of the present invention contemplate active NH3 stripper flows from about 150 sccm to about 3500 sccm. More particularly, from about 500 sccm to about 2500 sccm. More particularly still from about 750 sccm to about 2000 sccm, and most particularly at about 1500 sccm.

Alternative embodiments of this aspect of the present invention also contemplate diluent flows from about 0 sccm to about 3500 sccm. More particularly, from about 0 sccm to about 500 sccm. More particularly still from about 0 sccm to about 250 sccm, and most particularly at about 0 sccm. Alternative diluents, known to those having ordinary skill in the art may also be implemented.

Similarly, alternative embodiments contemplate chamber pressures from about 50 mTorr to about 1000 Mtorr. More particularly the chamber pressure may be from about 100 mTorr to about 500 mTorr. More particularly still, the chamber pressure may be from about 300 mTorr to about 400 mTorr, and most particularly about 350 mTorr.

The NH3 process produced better strip rates with less damage than the BKM hydrogen strip, previously discussed.

Where the previously defined stripping process follows another semiconductor manufacturing step requiring the use of a plasma, for instance an etching step, the methodology defined herein enables the change from, for instance etching, to photoresist strip without recourse to breaking vacuum within the reaction vessel. Instead, the process of the present invention contemplates that gas flows will be altered from the etching gas flow to the photoresist strip gas flow within the same reaction vessel.

Optionally, wafer backside cooling may be altered to provide an optimal wafer temperature to effect PR strip. Without being bound by theory, it is believed that cooling the wafer to temperatures below about 60° C. helps to prevent damage to the OSG layer during the photoresist stripping. Especially, when $O_2$ is used in the stripping gas. It is also believed that plasma confinement, such as the confinement provided by the confinement rings, prevents or reduces particle generation, such as the particle generation that is normally associated with $O_2$ or $NH_3$ etching. The ammonia stripping process may have the further advantage that it does not oxidize copper components within an integrated circuit device, thereby rendering this process more compatible with copper-based integrated circuit manufacture.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. In particular, the principles of the present invention specifically contemplate the incorporation of one or more of the various features and advantages taught herein on a wide variety of wafer stacks, dielectrics, hard masks, barrier materials, process equipment, wafer substrates, and photoresists. Moreover, the discussed frequencies, powers, flow rates, and pressures are illustrative of those found optimal for a given application. The present invention contemplates that other applications may require alternative values for these variables. Each of these alternatives is specifically contemplated by the principles of the present invention.

What is claimed is:

1. A method for stripping photoresist over at least one layer of organosilicate glass dielectric on a wafer, the method comprising:

introducing the wafer into a reaction chamber;

introducing a flow of stripping gas into the reaction chamber, the stripping gas consisting essentially of oxygen and nitrogen; and utilizing the stripping gas, forming a plasma within the reaction chamber, thereby stripping the photoresist from over the organosilicate glass dielectric, wherein oxygen acts as an active stripping agent.

2. The method, as recited in claim 1, further comprising cooling the wafer to a temperature between −10° C. to 40° C. during the utilizing the stripping gas.

3. The method, as recited in claim 2, further comprising confining the plasma with plasma rings.

4. The method, as recited in claim 2, wherein the wafer comprises at least one copper contact.

5. The method, as recited in claim 1, further comprising cooling the wafer to a temperature between −10° C. and 40° C. during the utilizing the stripping gas, and wherein the oxygen does not degrade the dielectric properties of the organosilicate glass.

6. The method, as recited in claim 1, further comprising etching a feature through the at least one layer of organosilicate glass after introducing the wafer into the reaction chamber and before introducing the flow of stripping gas into the reaction chamber.

7. The method, as recited in claim 1, wherein the utilizing the stripping gas strips substantially all of the photoresist from over the layer of organosilicate glass.

8. A method of forming an integrated circuit comprising at least one feature in a layer of organosilicate glass, comprising:

forming a photoresist mask over organosilicate glass;

introducing the layer of organosilicate glass into a reaction chamber;

introducing a flow of stripping gas into the reaction chamber, the stripping gas consisting essentially of oxygen and nitrogen; and utilizing the stripping gas, forming a plasma within the reaction chamber, thereby stripping the photoresist from the layer of organosilicate glass, wherein oxygen is an active stripping agent.

9. The method, as recited in claim 8, further comprising cooling the wafer to a temperature below 60° C. during the utilizing the stripping gas.

10. The method, as recited in claim 9, wherein the flow rate of the active stripping agent is between 150 sccm and 3500 sccm.

11. The method, as recited in claim 8, further comprising cooling the wafer to a temperature between −10° C. and 40° C. during the utilizing the stripping gas, and wherein the oxygen does not degrade the dielectric properties of the organosilicate glass.

12. The method, as recited in claim 8, further comprising etching a feature through the at least one layer of organosilicate glass after introducing the layer of organosilicate glass into the reaction chamber and before introducing the flow of stripping gas into the reaction chamber.

13. The method, as recited in claim 8, wherein the utilizing the stripping gas strips substantially all of the photoresist from over the layer of organosilicate glass.

* * * * *